(12) United States Patent
Kim et al.

(10) Patent No.: US 12,431,414 B2
(45) Date of Patent: Sep. 30, 2025

(54) POWER MODULE AND MANUFACTURING METHOD THEREOF

(71) Applicants: Hyundai Motor Company, Seoul (KR); Kia Corporation, Seoul (KR)

(72) Inventors: Hyeon Uk Kim, Hwaseong-Si (KR); Myung Ill You, Gwangju (KR); Hyun Koo Lee, Seoul (KR); Jun Hee Park, Hwaseong-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 510 days.

(21) Appl. No.: 17/869,267

(22) Filed: Jul. 20, 2022

(65) Prior Publication Data

US 2023/0197590 A1  Jun. 22, 2023

(30) Foreign Application Priority Data

Dec. 21, 2021 (KR) .................. 10-2021-0183977

(51) Int. Cl.
*H01L 23/498* (2006.01)
*H01L 21/48* (2006.01)
*H01L 23/00* (2006.01)

(52) U.S. Cl.
CPC .... *H01L 23/49811* (2013.01); *H01L 21/4846* (2013.01); *H01L 23/49833* (2013.01);
(Continued)

(58) Field of Classification Search
CPC ..... H01L 21/4846; H01L 24/33; H01L 24/73; H01L 23/4334; H01L 23/49838; H01L 23/057; H01L 24/90; H01L 24/29; H01L 23/49811; H01L 23/3121; H01L 24/32; H01L 23/49833; H01L 24/49; H01L 23/051; H01L 24/83; H01L 23/3735; H01L 24/48; H01L 23/293; H01L 24/42; H01L 24/81; H01L 24/92; H01L 24/16; H01L 21/4803; H01L 23/04; H01L 23/3675; H01L 23/427; H01L 21/4871; H01L 25/50; H01L 2224/73215; H01L 2224/32225; H01L 2224/48175; H01L 2224/131;
(Continued)

(56) References Cited

U.S. PATENT DOCUMENTS 7,528,005 B2 * 5/2009 Takahashi ............... H01L 24/24
                                                                 438/109
9,859,262 B1 * 1/2018 Patel .................. H01L 25/0657
(Continued)

FOREIGN PATENT DOCUMENTS

| JP | 2019-176063 | 10/2019 |
| KR | 10-2018-0138466 | 12/2018 |
| KR | 10-2020-0129699 | 11/2020 |

*Primary Examiner* — Mouloucoulaye Inoussa
(74) *Attorney, Agent, or Firm* — MORGAN, LEWIS & BOCKIUS LLP

(57) ABSTRACT

A power module and a manufacturing method includes a chip; an upper substrate provided above the chip and formed with a circuit pattern; a lower substrate provided below the chip and formed with a circuit pattern; and a spacer including a plurality of metal portions electrically connecting at least two among the chip, the upper substrate and the lower substrate to transmit an electrical signal, and an insulating portion positioned between the plurality of metal portions and insulating the metal portions.

18 Claims, 6 Drawing Sheets

(52) U.S. Cl.
CPC ........ *H01L 23/49838* (2013.01); *H01L 24/32* (2013.01); *H01L 24/48* (2013.01); *H01L 24/73* (2013.01); *H01L 24/90* (2013.01); *H01L 2224/32225* (2013.01); *H01L 2224/48175* (2013.01); *H01L 2224/73215* (2013.01)

(58) Field of Classification Search
CPC ..... H01L 2225/1094; H01L 2224/2518; H01L 2224/92225; H01L 2224/81005; H01L 2224/13147; H01L 2224/214; H01L 2225/1035; H01L 2224/13139; H01L 2224/32245; H01L 2221/68372; H01L 2224/02372; H01L 2225/1041; H01L 2924/15311; H01L 2224/04105; H01L 2224/73253; H01L 2221/68359
See application file for complete search history.

(56) References Cited

U.S. PATENT DOCUMENTS

| | | | | |
|---|---|---|---|---|
| 9,922,911 | B1* | 3/2018 | Park | H01L 23/49562 |
| 10,515,904 | B2* | 12/2019 | Lin | H01L 23/49805 |
| 2002/0012231 | A1* | 1/2002 | Bhatia | H01L 23/3675 |
| | | | | 361/704 |
| 2008/0128882 | A1* | 6/2008 | Baek | H01L 25/50 |
| | | | | 438/109 |
| 2010/0230800 | A1* | 9/2010 | Beaupre | H01L 23/473 |
| | | | | 257/691 |
| 2014/0063768 | A1* | 3/2014 | Tanaka | H05K 1/185 |
| | | | | 29/830 |
| 2015/0037575 | A1* | 2/2015 | Sakaguchi | C09D 133/00 |
| | | | | 156/60 |
| 2015/0054148 | A1* | 2/2015 | Jang | H01L 25/105 |
| | | | | 257/713 |
| 2016/0126157 | A1* | 5/2016 | Jeon | H01L 23/051 |
| | | | | 257/693 |
| 2017/0338176 | A1* | 11/2017 | Tsuyuno | H01L 23/49838 |
| 2018/0102301 | A1* | 4/2018 | Jeon | H01L 25/50 |
| 2018/0174945 | A1* | 6/2018 | Park | H01L 25/072 |
| 2018/0211938 | A1* | 7/2018 | Tsuyuno | H01L 25/18 |
| 2019/0051586 | A1* | 2/2019 | Park | H01L 23/051 |
| 2019/0252993 | A1* | 8/2019 | Uneme | H02M 7/003 |
| 2019/0295923 | A1* | 9/2019 | Karouji | H01L 23/49568 |
| 2019/0341332 | A1* | 11/2019 | Lin | H01L 23/3121 |
| 2020/0135683 | A1* | 4/2020 | Kim | H01L 23/481 |
| 2020/0176385 | A1* | 6/2020 | Sung | H01L 23/145 |
| 2020/0343155 | A1* | 10/2020 | Kiyonaga | H05K 1/0206 |
| 2020/0373216 | A1* | 11/2020 | Yoo | H01L 24/05 |
| 2021/0151374 | A1* | 5/2021 | Zou | H01L 23/645 |
| 2021/0202392 | A1* | 7/2021 | Kung | H01L 25/105 |
| 2021/0217679 | A1* | 7/2021 | Cheng | H01L 24/32 |
| 2021/0327842 | A1* | 10/2021 | Kim | H01L 24/29 |
| 2022/0013432 | A1* | 1/2022 | Shimazu | H01L 23/3677 |
| 2022/0044988 | A1* | 2/2022 | Park | H05K 3/3468 |
| 2022/0115291 | A1* | 4/2022 | Kim | H01L 23/4334 |
| 2023/0005813 | A1* | 1/2023 | Fujinaga | H01L 24/08 |

* cited by examiner

<bidirectional>

<unidirectional>

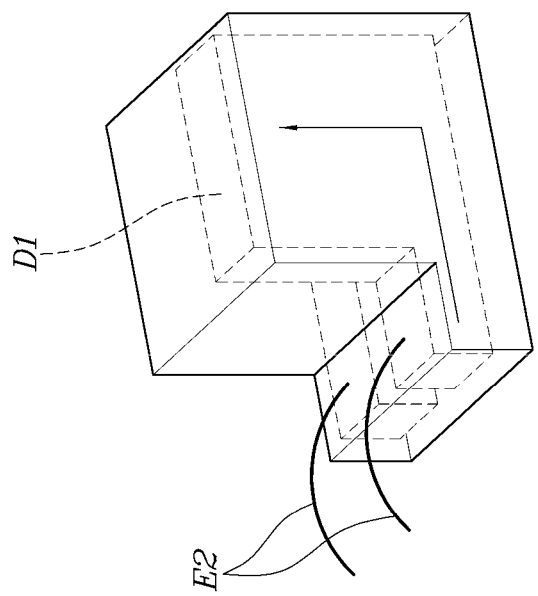
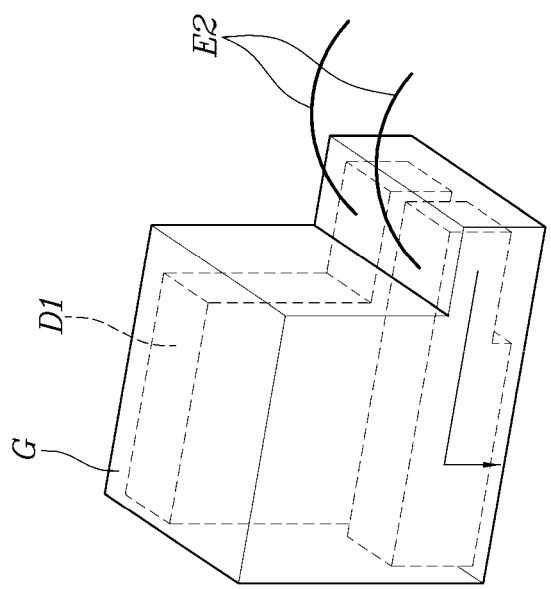
FIG. 4A
FIG. 4B

POWER MODULE AND MANUFACTURING METHOD THEREOF

CROSS REFERENCE TO RELATED APPLICATION

The present application claims priority to Korean Patent Application No. 10-2021-0183977, filed Dec. 21, 2021, the entire contents of which is incorporated herein for all purposes by this reference.

BACKGROUND OF THE PRESENT DISCLOSURE

Field of the Present Disclosure

The present disclosure relates to a power module and a manufacturing method thereof, and more particularly to a power module, which includes a spacer for electrically connecting at least two of a chip, an upper substrate and a lower substrate and transmitting an electrical signal, and a manufacturing method thereof.

Description of Related Art

In a conventional power module, semiconductor chips are concentrated on either substrates, and only a horizontal structure using a wire or the like is possible for transmission of electrical signals needed for the semiconductor chips.

Such a conventional power module has problems in that there are many limitations on a substrate design and there are many unnecessary parts because the semiconductor chips, electric patterns for the signal transmission of the chips, etc., are all concentrated on either of the substrates. Furthermore, a power module that does not use a power-module epoxy resin has a problem in that a low viscosity-based filling molding is not possible.

Furthermore, a spacer cannot simultaneously transmit electric signals to both upper and lower insulating substrates provided above and below the semiconductor chip, and it is therefore impossible to make signal transmission circuit parts in a 3D structure. Furthermore, the substrate is not efficiently designed because there are limitations on the width of a fine signal connection line.

The information included in this Background of the present disclosure section is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a spacer configured for electrically connecting at least two among a chip, an upper substrate and a lower substrate and transmitting an electrical signal, so that the spacer can have various shapes. An epoxy resin is characterized in high heat resistance and insulation and filled using low viscosity, electrically insulating the structure of the spacer.

Furthermore, with such structure, signal transmission circuit portions may be made in a 3D structure and there are no limitations on the width of a fine signal connection line, making it possible to efficiently design the substrate. Furthermore, the efficient design of the substrate makes it possible to remove unnecessary insulation substrates and thus reduces the costs of materials.

According to an aspect of the present disclosure, a power module includes: a chip; an upper substrate provided above the chip and formed with a circuit pattern; a lower substrate provided below the chip and formed with a circuit pattern; and a spacer including a plurality of metal portions electrically connecting at least two among the chip, the upper substrate and the lower substrate to transmit an electrical signal, and an insulating portion positioned between the plurality of metal portions and insulating the metal portions.

The plurality of metal portions in the spacer may receive an electrical signal from the upper substrate and the lower substrate and transmit the electrical signal to the lower substrate and the upper substrate.

The plurality of metal portions in the spacer may receive an electrical signal through a plurality of wires connected to the chip, and transmit an electrical signal by electrically connecting at least two among the chip, the upper substrate and the lower substrate.

The plurality of metal portions in the spacer may transmit electrical signals simultaneously by electrically connecting at least two among the chip, the upper substrate and the lower substrate.

The plurality of metal portions in the spacer may include an end portion selectively connected to the upper substrate or the lower substrate and transmitting the electrical signal by electrically connecting at least two among the chip, the upper substrate and the lower substrate.

The spacer may be formed as 3D shapes to transmit electrical signals to the upper substrate and the lower substrate.

The insulating portion in the spacer may be formed of an epoxy resin and insulates the metal portions.

The plurality of metal portions in the spacer may be joined to and electrically connected to the upper or lower substrate by soldering or sintering.

According to an aspect of the present disclosure, a method of manufacturing a power module includes: preparing a plurality of metal portions for transmitting an electrical signal by processing a metal working structure to electrically connect at least two among a chip, an upper substrate, and a lower substrate; insulating the metal portions with an insulating portion on the processed metal working structure; and joining the insulated metal working structure with a metal layer or bonding the chip and a wire.

The plurality of metal portions may form a signal transmission path for transmitting an electrical signal.

The signal transmission path may be formed as a plurality of protruding shapes to receive an electrical signal from at least two among the chip, the upper substrate and the lower substrate.

The method may further include reinforcing insulation joining strength through surface treatment of the processed metal working structure after preparing the plurality of metal portions.

The preparing the plurality of metal portions may include a plurality of metal portions that receive electrical signals from the upper and lower substrates and transmit the electrical signals to the lower substrate and the upper substrate.

The insulating the metal portions may include insulating the metal portions with the insulating portion formed of an epoxy resin.

According to the present disclosure, the spacer can electrically connect at least two among the chip, the upper substrate and the lower substrate and transmit the electrical signal, so that the spacer can have various shapes. The epoxy resin is characterized by high heat resistance and insulation and filled using low viscosity, electrically insulating the structure of the spacer. Therefore, with the present structure, signal transmission circuit portions may be made in a 3D structure, and there are no limitations on the width of a fine signal connection line, making it possible to design the substrate efficiently. Furthermore, the efficient design of the substrate makes it possible to remove unnecessary insulation substrates and thus reduces the costs of materials.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 4A and FIG. 4B are views showing the spacer of FIG. 3 in detail.

Figure 1B:
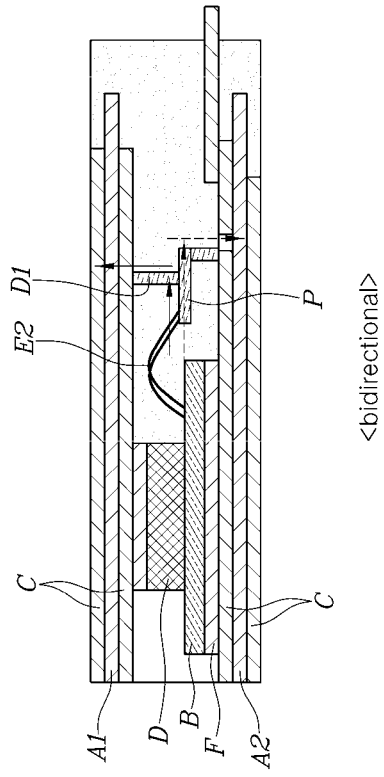
FIG. 1A and FIG. 1B are views showing that a spacer transmits an electrical signal unidirectionally or bidirectionally in a power module.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Regarding embodiments of the present disclosure included in the exemplary embodiment or application, the specific structural or functional description is merely illustrative for describing the exemplary embodiments of the present disclosure, and embodiments of the present disclosure may be implemented in various forms but not be construed as being limited to the exemplary embodiments set forth in the exemplary embodiment or application.

Because the exemplary embodiments of the present disclosure may be variously modified and have various forms, specific exemplary embodiments will be illustrated in the drawings and described in detail in the exemplary embodiment or application. However, it should be understood that embodiments of the present disclosure are intended not to be limited to the specific embodiments but to cover all modifications, equivalents or alternatives without departing from the spirit and technical scope of the present disclosure.

Unless defined otherwise, all terms used herein including technical or scientific terms have the same meanings as those generally understood by a person having ordinary knowledge in the art to which the present disclosure pertains. The terms such as those defined in generally used dictionaries are construed to have meanings matching that in the context of related technology, and unless clearly defined otherwise, are not construed to be ideally or excessively formal.

Below, the present disclosure will be described in detail by describing embodiments with reference to the accompanying drawings. Like reference numerals in the drawings refer to like numerals.

Figure 1A:
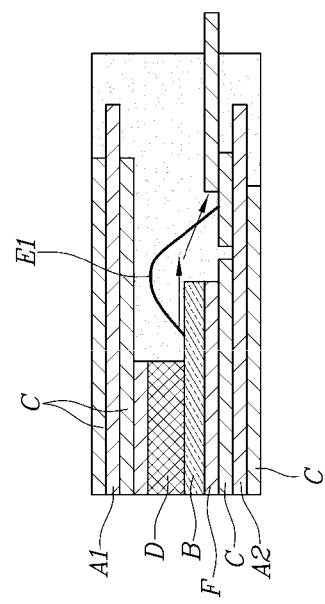

FIG. 1A and FIG. 1B are views showing that a spacer D transmits an electrical signal unidirectionally or bidirectionally in a power module.

Referring to FIG. 1B, a power module includes a chip B; an upper substrate A1 provided above the chip B and formed with a circuit pattern; a lower substrate A2 provided below the chip B and formed with a circuit pattern; and a spacer D1 electrically connecting at least two of the chip B, the upper substrate A1, and the lower substrate A2 and including a plurality of metal portions for transmitting the electrical signal and an insulating portion positioned between the plurality of metal portions and insulating the metal portions from each other.

According to the present disclosure, it is characterized that the spacer D1 is configured to transmit an electrical signal by electrically connecting at least two among the chip B, the upper substrate A1, and the lower substrate A2.

In a general power module, the chip B is concentrated on only the lower substrate A2, and therefore the electrical signal needed for the chip B is transmitted through a wire E1 or a metal clip on the lower substrate Alternatively, an electrical signal is transmitted from the lower substrate A2 of the power module to another lower substrate A2 of another power module. In such a general power module, an electric pattern for transmitting the electrical signal for the chip B is concentrated on the lower substrate A2, and thus there are many limitations on the design of the lower substrate A2 as the lower substrate A2 needs to be enlarged.

FIG. 1A shows a conventional power module and FIG. 1B shows a power module according to the present disclosure. In the conventional power module, the electric pattern is concentrated on only the lower substrate A2, making it impossible to transmit an electrical signal by electrically connecting at least two among the chip B, the upper substrate A1, and increasing the overall sizes of the lower substrate A2 and the power module.

The chip B refers a semiconductor chip B that generates heat as soon as an electrical signal is transmitted thereto. The upper substrate A1 and the lower substrate A2 are respectively provided above and below the chip B, forming a circuit pattern. In the conventional power module, the circuit pattern is formed on only the lower substrate A2, and it is therefore impossible to efficiently design the insulating substrate. On the other hand, in the power module according to the present disclosure, the transmission of the electrical signal necessary for the chip B, of which the lower substrate A2 is in charge, is distributed to the upper substrate A1, so that the insulating substrate may be more efficiently designed.

The upper substrate A1 includes an external upper substrate A1 positioned at an external side and an internal upper substrate A1 positioned at an internal side with respect to the chip B. Likewise, the lower substrate A2 an includes an external lower substrate A2 and an internal lower substrate A2. Furthermore, a cooling channel is provided in the external upper substrate A1 and the external lower substrate A2, dissipating heat generated in the chip B. Furthermore, the chip B, the lower substrate A2, and the upper substrate A1 are attached to each other by an adhesive material F.

Furthermore, the spacer D includes the plurality of metal portions and the insulating portion. The plurality of metal portions have end portions electrically connected to the chip B, the upper substrate A1 or the lower substrate A2, and electrically connecting at least two among the chip B, the upper substrate A1, and the lower substrate A2 to transmit an electrical signal. The insulating portion is interposed between the plurality of metal portions and is configured to insulate the metal portions.

The spacer D1 according to the present disclosure has a signal transmission circuit in a 3D structure for electrically connecting at least two among the chip B, the upper substrate A1, and the lower substrate A2. In other words, the spacer D1 may be used for electrical connection between the chip B and the upper substrate A1, between the chip B and the lower substrate A2, among the upper substrate A1, the lower substrate A2 and the chip B, and between the upper substrate A1 and the lower substrate A2.

Referring to FIG. 1B, the spacer D1 according to various exemplary embodiments of the present disclosure may receive an electrical signal from the chip B and transmit the electrical signal to the upper substrate A1 or the lower substrate A2, or may receive an electrical signal from the upper substrate A1 or the lower substrate A2 and transmit the electrical signal to the chip B, in which all the chip B, the upper substrate A1, and the lower substrate A2 may be electrically connected.

In an exemplary embodiment of the present invention, the electrical signal needed for the chip B is connected through a wire E2 to the spacer D1.

Figure 2:
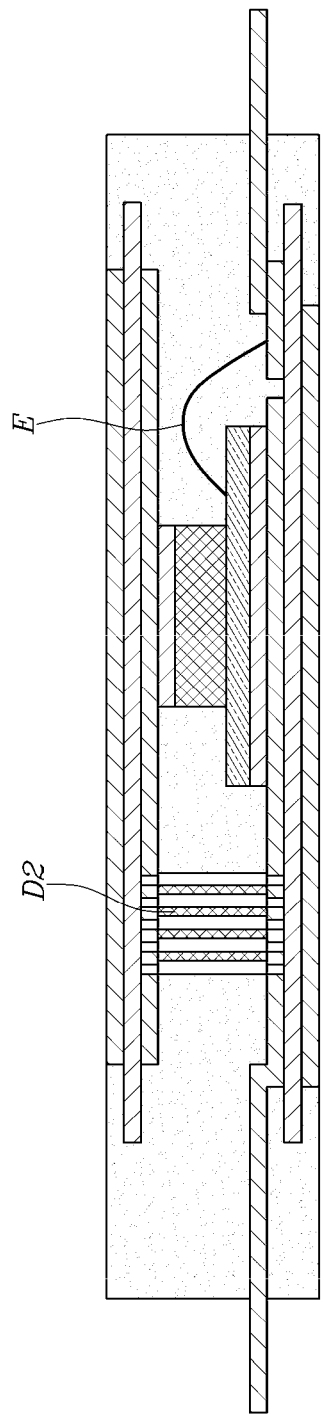
FIG. 2 is a view showing a spacer that receives electrical signals from an upper substrate and a lower substrate and transmits the electrical signals to the lower substrate and the upper substrate.

In an exemplary embodiment of the present disclosure, the spacer D1 may have the same structure of the spacer D2 as shown in FIG. 2, and may transmit an electrical signal from the upper substrate A1 to the lower substrate A2 or from the lower substrate A2 to the upper substrate A1.

The plurality of metal portions in the spacer D may be joined to and thus electrically connected to the upper substrate A1 or the lower substrate A2 by soldering or sintering. A method of joining the plurality of metal portions is not limited to the soldering or the sintering, but may include any joining method that can ensure high reliability even at high temperatures.

Figure 3:
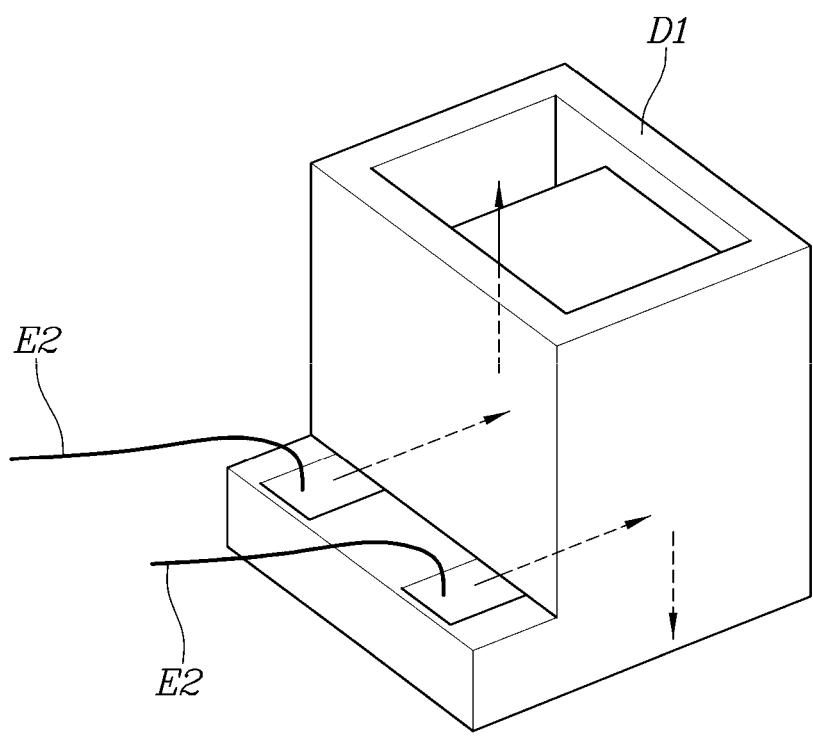
FIG. 3 is a view showing a spacer that receives electrical signals through a plurality of wires, and is insulated with an epoxy resin.

FIG. 3 is a view showing a spacer D1 that receives electrical signals through a plurality of wires E2, and is insulated with an epoxy resin G. FIG. 4A and FIG. 4B are views showing the spacer D1 of FIG. 3 in detail. The insulating portion of the spacer D may be formed of the epoxy resin G and insulate the metal portions from each other, in which the epoxy resin G is characterized in high heat-resistance and insulation, having durability against heat generated in the chip B and insulating the plurality of metal portions in the spacer D.

Similarly, the spacer D1 to be described blow, which includes the plurality of metal portions to receive the electrical signals from the upper substrate A1 and the lower substrate A2 and transmit the electrical signals to the lower substrate A2 and the upper substrate A1, may also include the epoxy resin G between the plurality of metal portions, having a shape including various paths.

FIG. 2 is a view showing the spacer D2 that receives electrical signals from the upper substrate A1 and the lower substrate A2 and transmits the electrical signals to the lower substrate A2 and the upper substrate A1.

Figure 5:
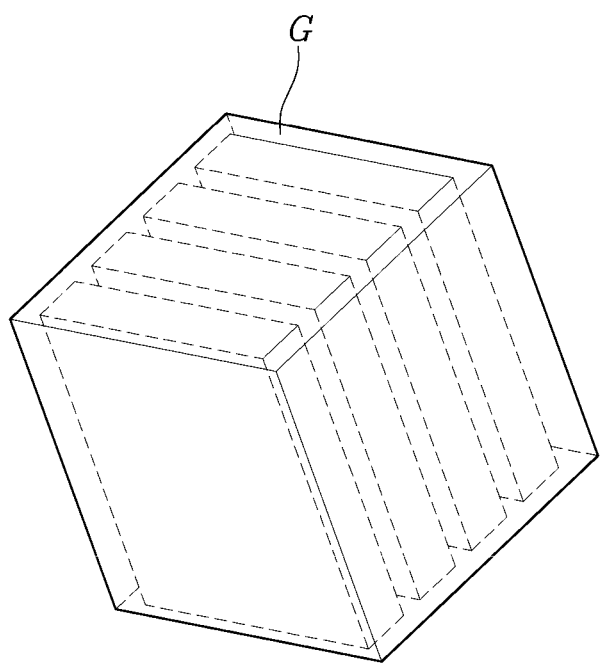
FIG. 5 is a view showing the spacer of FIG. 2 in detail.

FIG. 5 is a view showing the spacer D2 of FIG. 2 in detail.

Referring to FIGS. 2 and 5, each of the metal portions in the spacer D2 is characterized by receiving electrical signals from the upper substrate A1 and the lower substrate A2 and transmitting the electrical signal to the lower substrate A2 and the upper substrate A1.

Alternatively, as shown in FIG. 3 and FIGS. 4A and 4B, the plurality of metal portions in the spacer D1 may be characterized in receiving an electrical signal through the plurality of wires E2 connected to the chip B and transmitting the electrical signal between at least two among the chip B, the upper substrate A1, and the lower substrate A2 by electrically connecting them.

The spacer D1 may directly receive the electrical signal from the chip B, and electrically connect at least two among the chip B, the upper substrate A1, and the lower substrate A2, so that the electrical signal may be transmitted between them. In the case where the spacer D2 does not directly receive an electrical signal from the chip B but directly receives an electrical signal from the upper substrate A1 or the lower substrate A2 which receives the electrical signal from the chip B, the spacer D2 transmits the electrical signal to the lower substrate A2 when the electrical signal is received from the upper substrate A1, and transmits the electrical signal to the upper substrate A1 when the electrical signal is received from the lower substrate A2.

When the electrical signals are transmitted from the upper substrate A1 and the lower substrate A2 to the lower substrate A2 and the upper substrate A1, the spacer D2 may be positioned regardless of the positions of the plurality of wires E2. Furthermore, according to the various exemplary embodiments of the present disclosure, the plurality of metal portions of the spacer D1 may be characterized in electrically connecting at least two among the chip B, the upper substrate A1, and the lower substrate A2 and simultaneously transmitting the electrical signal to the at least two thereof.

According to the various exemplary embodiments of the present disclosure, the spacer D1 in the power module may be formed as 3D shapes for transmitting the electrical signals to the upper substrate A1 and the lower substrate A2. The 3D shapes, i.e., the shapes of the spacer D, to which the plurality of wires E2 are respectively connected, are connected to the upper substrate A1 and the lower substrate A2 to transmit the electrical signals.

In the instant case, the electrical signals are simultaneously transmitted to the upper substrate A1 and the lower substrate A2 along an internal metal portion, and thus the functions of parts mounted onto the upper substrate A1 and the lower substrate A2 are controllable with fine signals.

The end portions of the plurality of metal portions in the spacer D1 are selectively connected to the upper substrate A1 or the lower substrate A2, transmitting the electrical signals by electrically connecting at least two among the chip B, the upper substrate A1, and the lower substrate A2.

In both the spacer D1 according to the various exemplary embodiments of the present disclosure, which transmits the electrical signal directly received from the chip B, and the spacer D2 according to the various exemplary embodiments of the present disclosure, which transmits the electrical signals directly received from the upper substrate A1 or the lower substrate A2 to the lower substrate A2 and the upper substrate A1, the end portion of the metal portion is connected to the upper substrate A1 or the lower substrate A2.

In the various exemplary embodiments of the present disclosure, the spacer D1 needs to be electrically connected to the upper substrate A1 or the lower substrate A2 to directly transmit the electrical signal to the upper substrate A1 or the lower substrate A2, and include the plurality of metal portions, one side of which need to be connected to the chip B to receive the electrical signal from the chip B. When the electrical signal is received from the chip B, the electrical signal is transmitted to the upper substrate A1 and the lower substrate A2 simultaneously. In the various exemplary embodiments of the present disclosure, the spacer D2 directly receives the electrical signal from the upper substrate A1 or the lower substrate A2, and transmits the electrical signal to the lower substrate A2 and the upper substrate A1 because the end portion of the metal portion is connected to the upper substrate A1 or the lower substrate A2.

Figure 6:
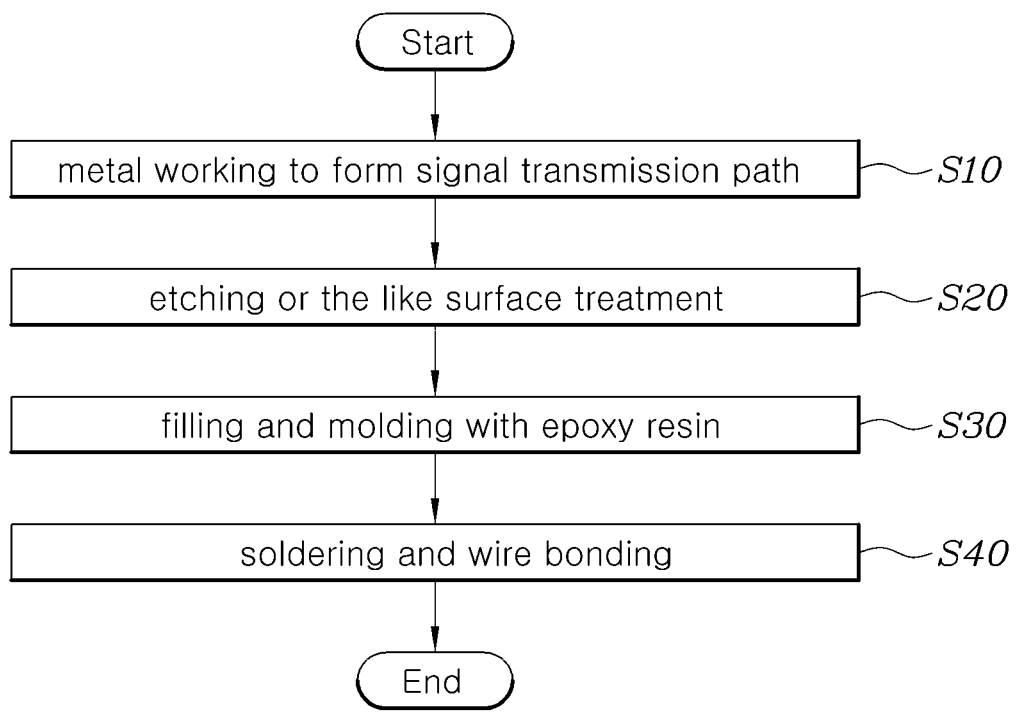
FIG. 6 is a flowchart showing a method of manufacturing the power module of FIG. 1.

FIG. 6 is a flowchart showing a method of manufacturing the power module of FIG. 1.

The method of manufacturing the power module includes the steps of:
preparing the plurality of metal portions for transmitting an electrical signal by processing a metal working structure to electrically connect at least two among the chip B, the upper substrate A1 and the lower substrate A2 (S10);
insulating the metal portion by the insulating portion on the processed metal working structure (S30); and joining the insulated metal working structure with the metal layer or bonding the chip B and the wire E2 (S40).

Detailed technical characteristics in each step of manufacturing the power module according to the present disclosure are the same as or similar to those in the foregoing power module according to the present disclosure, and thus detailed descriptions thereof will be omitted.

The plurality of metal portions are characterized in that it includes a signal transmission path for transmitting an electrical signal, in which the signal transmission path includes a plurality of protruding shapes to receive the electrical signal from at least two among the chip B, the upper substrate A1, and the lower substrate A2.

The signal transmission path includes the plurality of protruding shapes so that a protruding metal portion P of the spacer D1 can receive an electrical signal from the chip B and transmit the electrical signal to the upper substrate A1 and the lower substrate A2, like shown in FIG. 1B as the various exemplary embodiments of the present disclosure. Furthermore, the protruding metal portion receives an electrical signal from the upper substrate A1 or the lower substrate A2, and transmits the electrical signal to the lower substrate A2 and the upper substrate A1, so that the signal transmission path can have a vertical structure like the various exemplary embodiments of the present disclosure as shown in FIG. 2.

After step S10 of preparing the plurality of metal portions, there may be added a step of reinforcing insulation joining strength through the surface treatment of the processed metal working structure (S20).

Step S10 of preparing the plurality of metal portions may be characterized in preparing the plurality of metal portions that receive electrical signals from the upper substrate A1 and the lower substrate A2 and transmit the electrical signals to the lower substrate A2 and the upper substrate A1.

Step S30 of insulating the metal portion may be characterized in that the metal portion is insulated with the insulating portion formed of the epoxy resin G. The epoxy resin G is characterized in high heat-resistance and insulation, and is filled using low viscosity, so that the spacer D1 or D2 may be structured to have electrical insulation. With the insulating portion formed of the epoxy resin G, the metal portion is subjected to insulation molding.

The spacer is capable of electrically connecting at least two among the chip, the upper substrate and the lower substrate and transmitting the electrical signal, so that the spacer can have various shapes and be structured to have electrical insulation. Accordingly, with the present structure, it is possible to make signal transmission circuit portions in a 3D structure, and there are no limitations on the width of a fine signal connection line so that the substrate may be efficiently designed, removing unnecessary insulation substrates and thus reducing costs.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module comprising:
a chip;
an upper substrate provided above the chip and formed with a circuit pattern;
a lower substrate provided below the chip and formed with a circuit pattern; and
a spacer including a plurality of metal portions electrically connecting at least two among the chip, the upper substrate and the lower substrate to transmit an electrical signal, and an insulating portion positioned between the plurality of metal portions and insulating the metal portions,
wherein the spacer is disposed laterally with respect to the chip, spaced apart from the chip, connected to the chip by a wire, and extends in a vertical direction to electrically connect the upper substrate and the lower substrate to transmit the electrical signal.

2. The power module of claim 1, wherein the plurality of metal portions in the spacer receives the electrical signal from the upper substrate and the lower substrate and transmits the electrical signal to the lower substrate and the upper substrate.

3. The power module of claim 1, wherein the plurality of metal portions in the spacer receives the electrical signal through a plurality of wires connected to the chip and the metal portions, and transmits an electrical signal by electrically connecting the at least two among the chip, the upper substrate and the lower substrate.

4. The power module of claim 3, wherein the plurality of metal portions in the spacer transmits electrical signals simultaneously by electrically connecting the at least two among the chip, the upper substrate and the lower substrate.

5. The power module of claim 3, wherein the spacer includes a protruding portion connected to the wires.

6. The power module of claim 1, wherein the plurality of metal portions in the spacer includes an end portion selectively connected to the upper substrate or the lower substrate and transmitting the electrical signal by electrically connecting the at least two among the chip, the upper substrate and the lower substrate.

7. The power module of claim 1, wherein the spacer is formed as 3D shapes to transmit electrical signals to the upper substrate and the lower substrate.

8. The power module of claim 1, wherein the insulating portion in the spacer is formed of an epoxy resin and insulates the metal portions.

9. The power module of claim 1, wherein the plurality of metal portions in the spacer is joined to and electrically connected to the upper substrate or the lower substrate by soldering or sintering.

10. A method of manufacturing a power module, the method including:
preparing a plurality of metal portions of the power module for transmitting an electrical signal by processing a metal working structure to electrically connect an upper substrate, and a lower substrate of the power module;
insulating the metal portions with an insulating portion on the processed metal working structure; and
disposing the insulated metal working structure laterally with respect to the chip, spaced apart from the chip, and a wire bonding the chip so that an electrical signal is transmitted.

11. The method of claim 10, wherein the plurality of metal portions forms a signal transmission path for transmitting an electrical signal.

12. The method of claim 11, wherein the signal transmission path is formed as a plurality of protruding shapes to receive the electrical signal from the at least two of the chip, the upper substrate and the lower substrate.

13. The method of claim 12, wherein the plurality of protruding shapes is formed by forming a protruding portion on the plurality of metal portions.

14. The method of claim 13, wherein the protruding portion is connected to the chip through the wire.

15. The method of claim 12, wherein the upper substrate and the lower substrate are connected to the chip through the wire.

16. The method of claim 10, further including reinforcing insulation joining strength through surface treatment of the processed metal working structure after preparing the plurality of metal portions.

17. The method of claim 10, wherein the preparing the plurality of metal portions includes a plurality of metal portions that receives electrical signals from the upper substrate and the lower substrate and transmits the electrical signals to the lower substrate and the upper substrate.

18. The method of claim 10, wherein the insulating the metal portions include insulating the metal portions with the insulating portion formed of an epoxy resin.

* * * * *